United States Patent [19]

Shimizu et al.

[11] Patent Number: 4,747,926

[45] Date of Patent: May 31, 1988

[54] CONICAL-FRUSTUM SPUTTERING TARGET AND MAGNETRON SPUTTERING APPARATUS

[75] Inventors: Tamotsu Shimizu, Yokohama; Hikaru Nishijima; Takeshi Oyamada, both of Takasaki; Shigeru Kobayashi, Tokyo, all of Japan

[73] Assignee: Hitachi, Ltd., Tokyo, Japan

[21] Appl. No.: 825,940

[22] Filed: Feb. 4, 1986

[30] Foreign Application Priority Data

Feb. 8, 1985 [JP] Japan ................................. 60-21642

[51] Int. Cl.[4] ............................................. C23C 14/34
[52] U.S. Cl. ................................. 204/298; 204/192.12
[58] Field of Search ............... 204/192 R, 298, 192.12

[56] References Cited

U.S. PATENT DOCUMENTS

| | | | |
|---|---|---|---|
| 3,562,142 | 2/1971 | Lamont, Jr. | 204/298 |
| 4,132,612 | 1/1979 | Penfold et al. | 204/298 X |
| 4,166,783 | 9/1979 | Turner | 204/298 X |
| 4,324,631 | 4/1982 | Meckel et al. | 204/298 X |
| 4,401,539 | 8/1983 | Abe et al. | 204/298 X |
| 4,436,602 | 3/1984 | Hava et al. | 204/298 X |
| 4,444,635 | 4/1984 | Kobayashi et al. | 204/298 X |
| 4,547,279 | 10/1985 | Kiyota et al. | 204/298 |
| 4,564,435 | 1/1986 | Wickersham | 204/298 |
| 4,569,746 | 2/1986 | Hutchinson | 204/192 R X |
| 4,604,180 | 8/1986 | Hirukawa et al. | 204/298 |

Primary Examiner—John F. Niebling
Assistant Examiner—Nam X. Nguyen
Attorney, Agent, or Firm—Antonelli, Terry & Wands

[57] ABSTRACT

A conical-frustum-sputtering target for use in a magnetron sputtering apparatus for forming a film on a planar substrate. The sputtering target includes a target member having at least a conical-frustum-shaped surface including a first surface portion parallel to a center portion of the planar substrate and spaced a first distance therefrom, a second surface portion parallel to at least an extension of a peripheral portion of the planar substrate and being spaced a second distance therefrom wherein the second distance is less than the first distance, and at least one-third surface portion inclined with respect to the planar substrate for interconnecting the first surface portion and the second surface portion. By utilizing such a sputtering target, a film having a uniform thickness can be formed on a substrate having side steps and such can be utilized to deposit metallic thin film for a minute wiring pattern and can be applied to a larger substrate.

14 Claims, 3 Drawing Sheets

CONICAL-FRUSTUM SPUTTERING TARGET AND MAGNETRON SPUTTERING APPARATUS

BACKGROUND OF THE INVENTION

This invention relates to a sputtering technique for making a film, and more particularly to a sputtering target suitable to form a film having a uniform thickness on a substrate with its uneven surface, e.g. a silicon wafer in the process of making an integrated circuits.

It is found that conventional sputtering apparatus provide a film with reduced steps coverage at its outer side steps as disclosed in SEMICONDUCTOR WORLD, 1984 September pages 125-131. It should be noted that the outer side step is referred to a dead angle of the step when the step is seen from a center of a film forming object, e.g. wafer.

The reduced step coverage may increase the resistance of wiring when a film is formed on the wiring material. Thus, the resultant semiconductor devices may exhibit their deteriorated performance or the wirings may be cut so that the production yield of the integrated circuits will be reduced and the reliability of the semiconductor devices will not be assured.

An example of the conventional planar magnetron sputtering devices, which uses a wafer serving as a film forming object and a target stationarily in the face of the wafer, serving as a supply source of particles of film material through a sputtering phenomenon was proposed in U.S. Pat. No. 4,444,635 "Film Forming Method" to Kobayashi et al.

When a wafer having a diameter of 125 mm is used as a film forming object in the above sputtering device, a wafer-target distance of 70-90 mm and a diameter of 120-140 mm of the plasma ring generated on the target are taken for uniform film forming on the wafer. In such a location, however, the amount of the film formed on outer side steps is primarily smaller than that on even parts and inner side steps which are referred to as surface of the steps capable of seeing from the center of a film forming object, thereby substantially deteriorating the step coverage of the outer side steps.

In order to obviate such a disadvantage, it can be proposed to increase the amount of the film to be formed on the outer side step by generating a plasma ring which is larger in its diameter than the diameter of a wafer, and also to carry out the film forming with a shortened distance between the wafer and target. When the film forming is actually carried out in such a manner, the film thickness becomes thicker in the periphery of the wafer, i.e. uniformity cannot be obtained on the entire wafer.

To compensate for the above defect, it can be proposed to carry out the film forming in the manner of simultaneously or individually generating not only the larger plasma ring but also a smaller plasma than the wafer diameter. In the sputtering apparatus using an ordinary planar target, however, this film forming using the smaller plasma ring does not provide a fundamental solution. Namely, the amount of the film formed on the inner side step in the periphery of the wafer and the even part is only increased whereas the coverage of the outer side step is substantially the same as or decreases in the conventional sputtering apparatus.

SUMMARY OF THE INVENTION

An object of this invention is to provide a sputtering apparatus capable of improving step coverage of the outer side step in the periphery of a wafer as a film forming object so as to provide an even film on an entire wafer.

In accordance with this invention, there is used a target which has an inclined surface composed of at least two parts of conical side faces which take inclined angles more than or equal to 0 degree and less than or equal to 90 degrees measured from a symmetrical axis, and plasma rings are simultaneously or individually generated on the inclined surface part and even surface part of the target.

The coverage of an outer side step in the periphery of a wafer can be improved by providing as small an amount of the film formed in the periphery as possible when generating a smaller plasma ring than the wafer. In this case, an inclination faced to the direction of the center of the wafer is provided on the portion of the target where a smaller plasma ring is generated, while the portion of the target where a bigger plasma ring is generated is parallel to the wafer or inclined to be faced to the direction of the center of the wafer.

DESCRIPTION OF THE PREFERRED EMBODIMENTS

Figure 1:
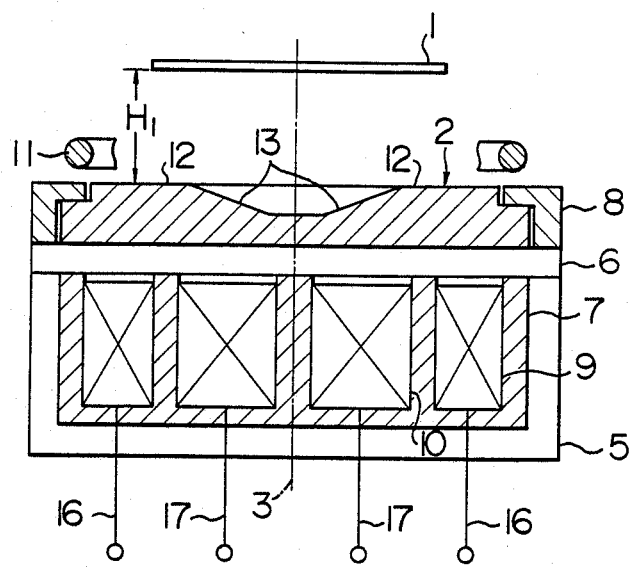
FIG. 1 is a vertical section of a sputtering apparatus having a multi-conical-frustum target according to one embodiment of this invention.

Referring now to FIG. 1, one embodiment of this invention will be explained. A wafer 1 and a target 2 are face each other, and wafer 1 is stationary while a film is formed. Target 2 is symmetrical with respect to its imaginary central axis 3 and is fixed to a backing plate 6 by a hold ring 8. A sputtering electrode 5 is fixed to the back surface of target 2 through backing plate 6, and two coils coaxially disposed around center axis 3 forms a magnetic circuit in a "cross-section covering" type yoke 7. Cooling water supplied between backing plate 6 and coils 9, 10 cools target 2 through backing plate and directly cools two coils 9, 10 (not shown).

A magnetron type glow discharge is performed in an atmosphere of Ar less than several milli Torrs in such a manner that a high voltage is applied between the sputtering electrode and an anode 11 disposed near the sputtering electrode (not shown). Target 2 comprises a surface portion 12 parallel to the wafer surface (this target surface makes its normal line parallel to center axis 3) and an inclined surface portion 13.

Figure 2:
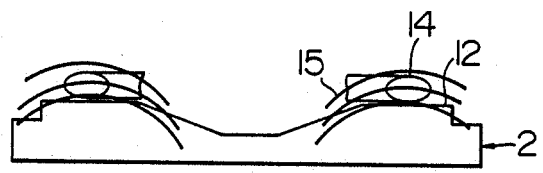
FIGS. 2 and 3 are views showing relations between plasma rings and magnetic fluxes which are generated on the target.
Figure 3:
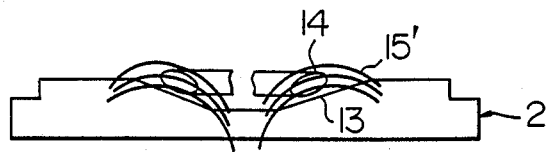

The magnetron type sputtering electrode, as seen from FIGS. 2 and 3, produces a plasma 14 at a position where the magnetic fluxes 15, 15' generated are parallel to the target surface. This is because the electric field is vertical to the target surface in its neighborhood, and the charged particles are converged by means of the Lorentz force at a portion where magnetic fluxes 15, 15' vertically intersect the electric field.

Thus, it is possible to change the plasma generating position by controlling the magnetic field distribution over the target; this is actually performed by varying the currents supplied from conducting lines 16 and 17 to coils 9 and 10. In this way, plasma 14 having a diameter larger than the wafer diameter is created on target surface 12, as shown in FIG. 2, to form a film primarily on the periphery of wafer 1. When the distance $H_1$ between wafer 1 and target 2 shown in FIG. 1 is particularly shortened, the amount of the film formed on the outer side step in the periphery of the wafer is increased so that the step coverage therefor is improved. On the other hand, plasma 14 having a diameter smaller than the wafer diameter is created on inclined target surface 13 facing to the center of wafer, as shown in FIG. 3, to form a film primarily on the inner part of wafer 1. Respective staying periods of plasma 14 created on target surfaces 12 and 13 are determined so as to form the film with uniform thickness distribution on the wafer.

Figure 4:
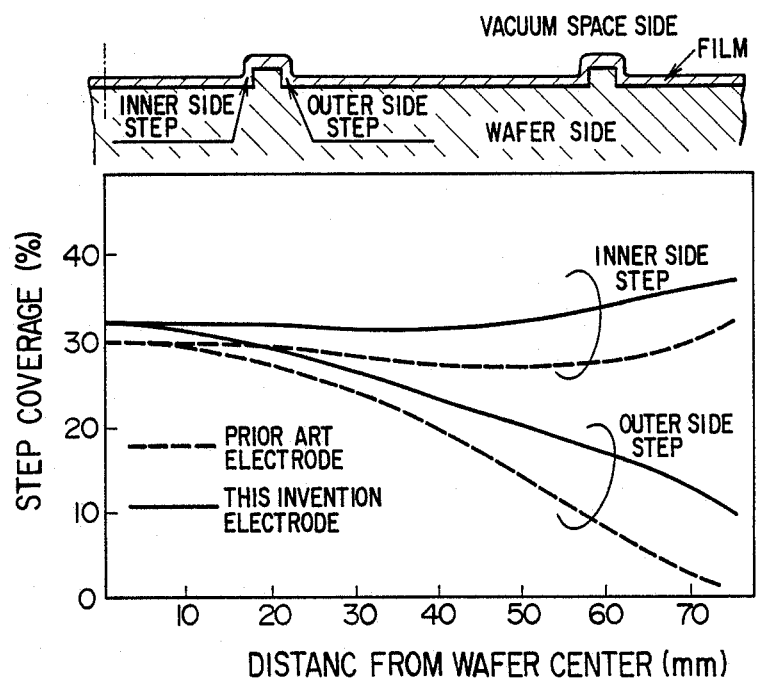
FIG. 4 is a graph showing step coverage of both outer sides step and inner side steps with respect to this invention and the prior art.

Comparison is made in FIG. 4 between the step coverage by the film formed using the conventional planar magnetron type sputtering electrode and the step coverage by the film formed in accordance with this invention. As seen from FIG. 4, in accordance with this invention, the step coverage at both inner and outer side steps in the wafer is improved, and particularly, the step coverage at the outer side step in the periphery of the wafer is greatly improved from 8% to 17%.

Figure 5:
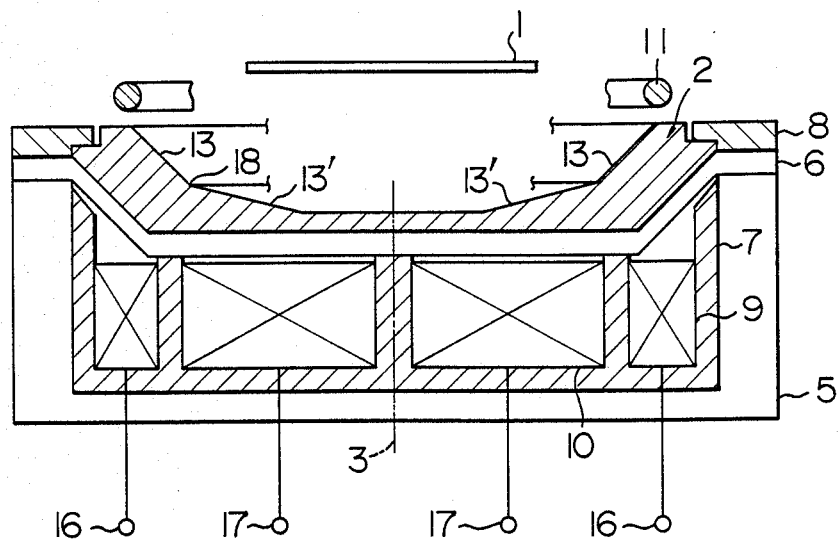
FIGS. 5 and 6 are vertical sections showing second and third embodiments of this invention.

A second embodiment of this invention will be explained with referrence to FIG. 5. In this embodiment, unlike the first embodiment, the entire target surface faces the wafer center and consists of two inclined surfaces 13 and 13' having different inclination angles, respectively. Target surfaces 13 and 13' are smoothly connected so that a sharp oblique junction is not made, thereby preventing electric field concentration at a junction 18 and so selective sputtering.

Plasmas can be generated on inclined surfaces 13 and 13', respectively by controlling the currents supplied to coils 9 and 10; the periphery of yoke 9 is extended to the target to generate the plasma at inclined surface 13.

The sputtering film forming at inclined target surface 13 serves to improve the step coverage at the peripheral part of wafer 1, while the sputtering film forming at inclined target surface 13' serves to improve the step coverage at the inner part of wafer 1.

An advantageous effect of this embodiment is that the entire target is in a multi-conical shape and so the particles emanated from the target are effectively employed for forming a film on the wafer. This embodiment is suitable to form a noble metal film through sputtering.

A third embodiment of this invention will be explained with reference to FIG. 6. As seen from the figure, a permanent magnet 21 is disposed through backing plate 6 at the side of target 2 opposite to the side thereof subjected to sputtering and is cooled together with backing plate 6 by water which is supplied from a feed-drain pipe 19.

A magnetic flux 20 generated by permanent magnet 21 consists of one magnetic flux component which emanates from one target surface and enters this surface again and the other magnetic flux component which emanates from the other inclined surface and enters this surface again.

Figure 6:
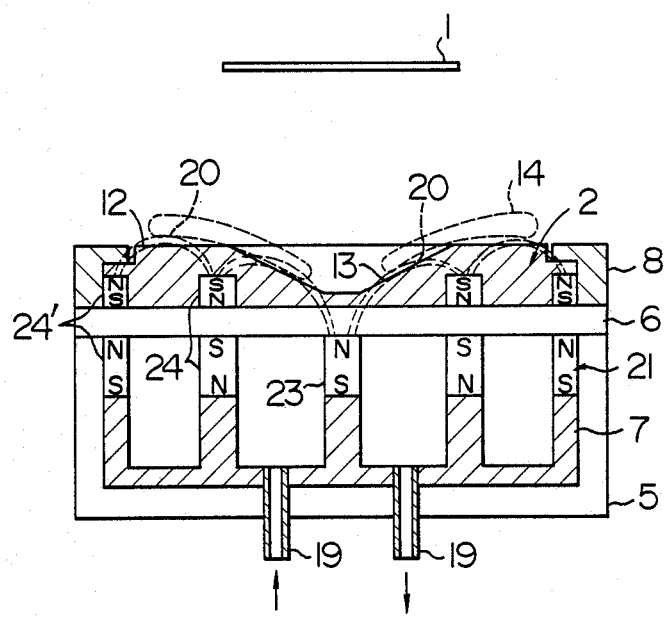

In order to form such a magnetic field using the target as shown in FIG. 6, a cylindrical permanent magnet 23 is disposed in the center, and permanent magnets 24 and 24' which are formed in annular or cylinder are coaxially disposed around the cylindrical permanent magnet 23; annular-shaped permanent magnets 24, 24' protrude beyond backing plate 6 to the target. This is implemented by fitting the permanent magnets in the target in this embodiment.

In accordance with this embodiment, plasmas can be generated on both target surfaces 12 and 13, and therefore, as a whole, plasma 14 can be substantially generated on the entire surface of the target. Thus, the power to be applied to the target can be increased so that the film can be formed at a higher speed; the erosion part of the target is extended so that the target can be effectively employed, lengthening the life of the target.

In accordance with this invention, a film having a uniform thickness is deposited all over a wafer and step coverages at inner and outer side steps are improved so that the wiring resistance of a miniaturized circuit, e.g. IC, LSI, etc. can be reduced, the production yield of semiconductor devices in their fabrication process can be improved and the disconnection of wirings due to poor step coverage can be prevented to improve the reliability of the semiconductor devices.

Further, in accordance with this invention, a wafer can be arranged more closely to a target than in the case of a sputtering apparatus using a plate target so that a film can be formed on the wafer at a higher speed. Namely, the plasma rings essentially serve as current flow paths, but the current can flow into the wafer depending upon the positional relation between the plasma rings and the anode used, or between the plasma rings and the wafer. In the conventional planar sputtering electrode, the plasma rings must be located in the neighborhood, and so such an inconvenience is likely to occur.

What is claimed is:

1. A conical-frustum-sputtering target for use in a magnetron sputtering apparatus for forming a film on a planar substrate comprising:

a target member being constituted in one body and having a size for enabling formation of erosion areas corresponding to the entirety of said planar substrate, said target member having at least a conical-frustum-shaped surface including a first surface portion parallel to a center portion of said planar substrate and being spaced a first distance therefrom, a second surface portion parallel to at least to an extension of a peripheral portion of said planar substrate so as to extend beyond a diameter of the peripheral portion of the planar substrate and being spaced a second distance therefrom, said second distance being less than said first distance, and at least one third surface portion inclined with respect to said planar substrate for interconnecting said first surface portion and said second surface portion, said second surface portion including a first target surface for forming a plasma having a diameter larger than the diameter of said planar substrate so as to enable a primary sputtering component of the plasma to be directed onto the peripheral portion of said planar substrate, said at least one third surface portion including a second target surface inclined with respect to said planar surface and disposed at a distance from said planar substrate greater than the distance of said first target surface from said planar substrate, said second target surface forming a plasma having a diameter smaller than the diameter of said planar substrate so as to enable a primary sputtering component of the plasma to be directed to the center of said planar substrate;

a backing plate for supporting said target member;

at least two magnetic-field-generating means for generating a magnetic field for at least enabling the plasma having the diameter larger than the diameter of said planar substrate to be formed on said first target surface so that the primary sputtering component of the plasma is directed onto the peripheral portion of said planar substrate, said at least two magnetic-field-generating means having solenoidal shapes and arranged to have a common central axis; and magnetic circuit means for converging a magnetic flux generating by said two magnetic-field-generating means on said surface of said target member, said magnetic circuit means being disposed adjacent to said backing plate.

2. A conical-frustum-sputtering target according to claim 1, wherein at least one of said two magnetic-field-generating means is an electromagnetic coil energized by a controlled-current source for generating and enclosing one ring-shaped plasma on the surface of said target member.

3. A conical-frustum-sputtering target according to claim 1, wherein said at least two magnetic-field-generating means include permanent magnets.

4. A conical-frustum-sputtering target according to claim 1, wherein said at least one third surface portion is inclined at an angle greater than 0° and less than 90° with respect to said planar substrate.

5. A conical-frustum-sputtering target according to claim 1, further comprising at least one smooth connection portion provided between said at least one third surface portion and at least one of said first surface portion and said second surface portion.

6. A magnetron sputtering apparatus for forming a film on a planar substrate comprising:

at least two magnetic-field-generating means having solenoid shaped and arranged to have a common central axis, said magnetic-field-generating means generating a magnetic field for generating and enclosing one ring-shaped plasma on at least predetermined surface portions of a sputtering target;

magnetic circuit means for converging a magnetic flux generated by said two-magnetic-field generating means on said sputtering target, said magnetic circuit means being disposed adjacent to a backing plate supporting said sputtering target;

said sputtering target being constituted in one body and being located at a stationary position confronting said planar substrate, said sputtering target having a size for enabling formation of erosion areas corresponding to the entirety of said planar substrate and having at least a concical-frustum-shaped surface, said conical-frustum-shaped surface including a first surface portion parallel to a center portion of said planar substrate and being spaced a first distance therefrom, a second surface portion parallel to at least an extension of a peripheral portion of said planar substrate so as to extend beyond a diameter of the peripheral portion of said planar substrate and being spaced a second distance therefrom, said second distance being less than said first distance, and at least one third surface portion inclined with respect to said planar substrate for interconnecting said first portion and said second portion, said second surface portion including a first target surface for forming thereon in response to said magnetic-field-generating means a plasma having a diameter larger than the diameter of said planar substrate so as to enable a primary sputtering component of the plasma to be directed onto the peripheral portion of said planar substrate, said at least one third surface portion including a second target surface inclined with respect to said planar surface and disposed at a distance from said planar substrate greater than the distance of said first target surface from said planar substrate, said second target surface forming a plasma having a diameter smaller than the diameter of said planar substrate so as to enable a primary sputtering component of the plasma to be directed to the center of said planar substrate.

7. A magnetron sputtering apparatus according to claim 6, further comprising power-supply means for supplying a current to said two magnetic-field generating means and for varying said current periodically so as to generate and enclose said ring-shaped plasma on at least two parts of said sputtering target.

8. A conical-frustum-sputtering target according to claim 6, wherein said at least two magnetic-field-generating means include permanent magnets.

9. A conical-frustum-sputtering target according to claim 6, wherein said at least one third surface portion is inclined at an angle greater than 0° and less than 90° with respect to said planar substrate.

10. A conical-frustum-sputtering target according to claim 6, further comprising at least one smooth connection portion provided between said at least one third surface portion and at least one of said first surface portion and said second surface portion.

11. A sputtering apparatus comprising:

at least two magnetic-field-generating means for generating a magnetic field for generating a plasma on at least predetermined surface portions of a sputtering target in a ring-shape and for enclosing the plasma, said two magnetic-field-generating means being arranged to have a central axis in common and having a solenoid shape;

power supply means for supplying a current to said two magnetic-field-generating means and for varying the magnetic flux intensity periodically thereby to generate the ring-shaped plasma and to enclose the plasma; and magnetic circuit means for converging the magnetic flux generated by said two magnetic-field-generating means on said sputtering target, said magnetic circuit means being disposed at a spacing from said sputtering target and being formed of a soft magnetic material;

said sputtering target constituted in one body located at a stationary position confronting a planar substrate on which a film is to be formed and being capable of forming erosion areas corresponding to the entirety of the planar substrate, said sputtering target having a target surface which is located adjacent said magnetic circuit means and facing the planar substrate, said target surface having at least a conical-frustum shape and having a first surface portion parallel to a center portion of the planar substrate and spaced a first distance therefrom, a second surface portion parallel to at least an extension of a peripheral portion of the planar substrate so as to extend beyond a diameter of the peripheral portion of said planar substrate and being spaced a second distance therefrom, the second distance being less than the first distance, and at least one third surface portion inclined with respect to the planar substrate and interconnecting the first and second portions of said target surface, said second surface portion including a first target surface for forming thereon in response to said magnetic-field-generating means a plasma having a diameter larger than the diameter of said planar substrate so as to enable a primary sputtering component of the plasma to be directed onto the peripheral portion of said planar substrate, said at least one third surface portion including a second target surface inclined with respect to said planar surface and disposed at a distance from said planar substrate greater than the distance of said first target surface from said planar substrate, said second target surface forming a plasma having a diameter smaller than the diameter of said planar substrate so as to enable a primary sputtering component of the plasma to be directed to the center of said planar substrate.

12. A conical-frustum-sputtering target according to claim 11, wherein said at least two magnetic-field-generating means include permanent magnets.

13. A conical-frustum-sputtering target according to claim 11, wherein said at least one third surface portion is inclined at an angle greater than 0° and less than 90° with respect to said planar substrate.

14. A conical-frustum-sputtering target according to claim 11, further comprising at least one smooth connection provided between between said at least one third surface portion and at least one of said first surface portion and said second surface portion.

* * * * *